United States Patent
Tang et al.

(10) Patent No.: US 8,264,835 B2
(45) Date of Patent: Sep. 11, 2012

(54) BASE AND ELECTRONIC DEVICE USING THE SAME

(75) Inventors: Yi-Chun Tang, Taipei (TW); Ho-Ching Huang, Taipei (TW); Hu-Chen Wang, Taipei (TW); I-Tien Hsieh, Taipei (TW); Mei-Yin Yeh, Taipei (TW)

(73) Assignee: Pegatron Corporation, Beitou District, Taipei (TW)

( * ) Notice: Subject to any disclaimer, the term of this patent is extended or adjusted under 35 U.S.C. 154(b) by 371 days.

(21) Appl. No.: 12/764,114

(22) Filed: Apr. 21, 2010

(65) Prior Publication Data

US 2010/0271765 A1     Oct. 28, 2010

(30) Foreign Application Priority Data

Apr. 28, 2009 (TW) ................................ 98207131 U (51) Int. Cl.
    *G06F 1/16*     (2006.01)
(52) U.S. Cl. ........... 361/679.43; 361/679.41; 361/679.3; 70/25; 70/58
(58) Field of Classification Search ............... 361/679.43
See application file for complete search history.

(56) References Cited

U.S. PATENT DOCUMENTS

| 5,406,811 | A | * | 4/1995 | Nakai | 70/26 |
| 5,531,082 | A | * | 7/1996 | Wolk et al. | 70/63 |
| 5,870,283 | A | | 2/1999 | Maeda | |
| 6,578,394 | B2 | | 6/2003 | Yin | |
| 6,581,420 | B1 | * | 6/2003 | Ling et al. | 70/58 |
| 6,711,921 | B1 | * | 3/2004 | Yang | 70/58 |
| 7,675,746 | B2 | * | 3/2010 | Crooijmans et al. | 361/679.41 |
| 7,684,188 | B2 | * | 3/2010 | Tzeng et al. | 361/679.57 |

FOREIGN PATENT DOCUMENTS

| CN | 2762209 Y | 3/2006 |
| CN | 101105703 A | 1/2008 |

* cited by examiner

*Primary Examiner* — Anthony Q Edwards
(74) *Attorney, Agent, or Firm* — Winston Hsu; Scott Margo (57) ABSTRACT

A base includes an engaging module, a release button and a code lock module. The release button presses the engaging module to release the host. The code lock module includes a cam assembly, a plurality of dials and a retaining assembly. The cam assembly includes cams arranged along an axis. Each of the dials has a recess for containing one of the cams. The retaining assembly includes a lock head and an elastic element. When one of the dials is rotated to separate one of the cams from the recess, the cam assembly pushes the lock head to be fastened to the release button and make the elastic element deform. When the dials are rotated to allow each recess to contain one cam, the cam assembly moves away from the lock head, and the elastic element restores to drive the lock head to be separated from the release button.

20 Claims, 7 Drawing Sheets

BASE AND ELECTRONIC DEVICE USING THE SAME

CROSS-REFERENCE TO RELATED APPLICATIONS

This Non-provisional application claims priority under 35 U.S.C. §119(a) on Patent Application No(s). 098207131 filed in Taiwan, Republic of China on Apr. 28, 2009, the entire contents of which are hereby incorporated by reference.

BACKGROUND OF THE INVENTION

1. Field of the Invention

This invention relates to a base and an electronic device using the same and, more particularly, to a base capable of locking a host of an electronic device via a code lock and the electronic device using the same.

2. Description of the Related Art

With general electronization of information, electronic products (such as a personal computer) have been a necessary part in people's daily life. To allow users to freely obtain information, various kinds of electronic products are developed to facilitate carrying by the users, and various kinds of portable electronic devices, such as a personal digital assistant (PDA), a personal navigation device (PND) and so on, are developed. A common notebook computer is taken for example. The notebook computer provides a quicker and more convenient working mode for a business man because of high portability thereof. The notebook computer has gradually occupied the leading position of a desktop computer in the personal computer market.

Because of the portability of the portable electronic devices, however, weight and dimensions of the bodies of the portable electronic devices are limited. Further, the price of the portable electronic devices is so expensive that the portable electronic devices easily become the objectives that illegal persons covet, particularly in some auctions, exhibitions or public places. If the users do not pay attention, expensive notebook computers or main parts of minicomputers may be stolen or lost, which causes monetary losses and may further cause confidential files in the notebook computers or the main parts of the minicomputers to leak out.

To prevent the notebook computers from being unauthorizedly moved by persons other than the users, various kinds of security lock holes are disposed at casings of the notebook computers to be locked by steel cable burglarproof locks having lock heads, such that the notebook computers can be fastened to a table top or a table leg via the steel cable burglarproof locks thus to reduce a risk that the notebook computers are unauthorizedly moved by other persons, stolen, or lost. For example, both a burglarproof lock device disclosed in U.S. Pat. No. 6,578,394 and the steel cable burglarproof lock aforementioned are designs for main bodies of the locks.

Although current lock manufacturing technique has already improved structure strength and precision of the locks to reduce probability of unauthorizedly opening or damaging the locks, latch parts of the locks may still be pulled out forcedly and the casings of the products may be seriously damaged at the same time since most of casings of computer products are made of plastic or thin metal materials. Therefore, if external force exceeding structure strength of the computer casings is directly applied to pull the locks, the structures of the computer casings around the lock holes can be damaged thus to allow the locks to lose the security function. Thus, the notebook computers or the main parts of the minicomputers may be stolen to cause the confidential files thereof to be lost.

In addition, even if the common notebook computers or the main parts of the minicomputers have the security lock holes (such as a Kensington lock hole) for being locked by the users, important electronic components (such as a hard disk, a memory, a CPU and so on) of the notebook computers or the main parts of the minicomputers mounted to bases can still be easily taken away thus to cause the confidential files to leak out. For example, the main parts of the minicomputers are mounted to the bases conventionally. However, the main parts of the minicomputers can be taken away only by simple tools or even without a tool.

BRIEF SUMMARY OF THE INVENTION

One objective of this invention is to provide a base and an electronic device using the same. The base in the invention can be used for detachably containing a host. The base includes an engaging module, a release button, and a code lock module. The engaging module is used for engaging the host. The release button is used for pressing the engaging module thus to allow the engaging module to release the host. The code lock module includes a cam assembly, a plurality of dials, and a retaining assembly.

The cam assembly includes a plurality of cams arranged along an axis.

The dials are rotatably connected with the cams respectively. Each of the dials has a recess for containing one of the cams.

The retaining assembly includes a lock head and an elastic element. The lock head is connected with the cam assembly and is capable of moving along the axis to be fastened to or separated from the release button. The elastic element is connected with the lock head.

When any one of the dials is rotated to separate at least one of the cams from the corresponding recess, the cam assembly moves along the axis to push the lock head to be fastened to the release button and make the elastic element being elastically deformed. When the dials are rotated to allow each recess to contain one cam, the cam assembly moves away from the lock head along the axis, and the elastic element is restored and drives the lock head to be separated from the release button thus to release the host by pressing the release button.

Compared with the prior art, the base and the electronic device using the same in the invention provide a code lock at the base to which the host of the electronic device (such as a minicomputer) is fastened, such that the host is fastened to the base thus to be properly locked to the base. Thereby, as the base and the electronic device using the same in the invention are used, an illegal person fails to make an illegal act by easily taking away the host from the base.

These and other features, aspects, and advantages of the present invention will become better understood with regard to the following description, appended claims, and accompanying drawings.

DETAILED DESCRIPTION OF THE INVENTION

This invention provides a base and an electronic device using the same. More particularly, the invention provides a code lock at the base to which a host of the electronic device (such as a minicomputer) is fastened, such that the host is fastened to the base thus to be properly locked to the base. Preferred embodiments of the invention are described in detail hereinbelow.

Figure 1A:
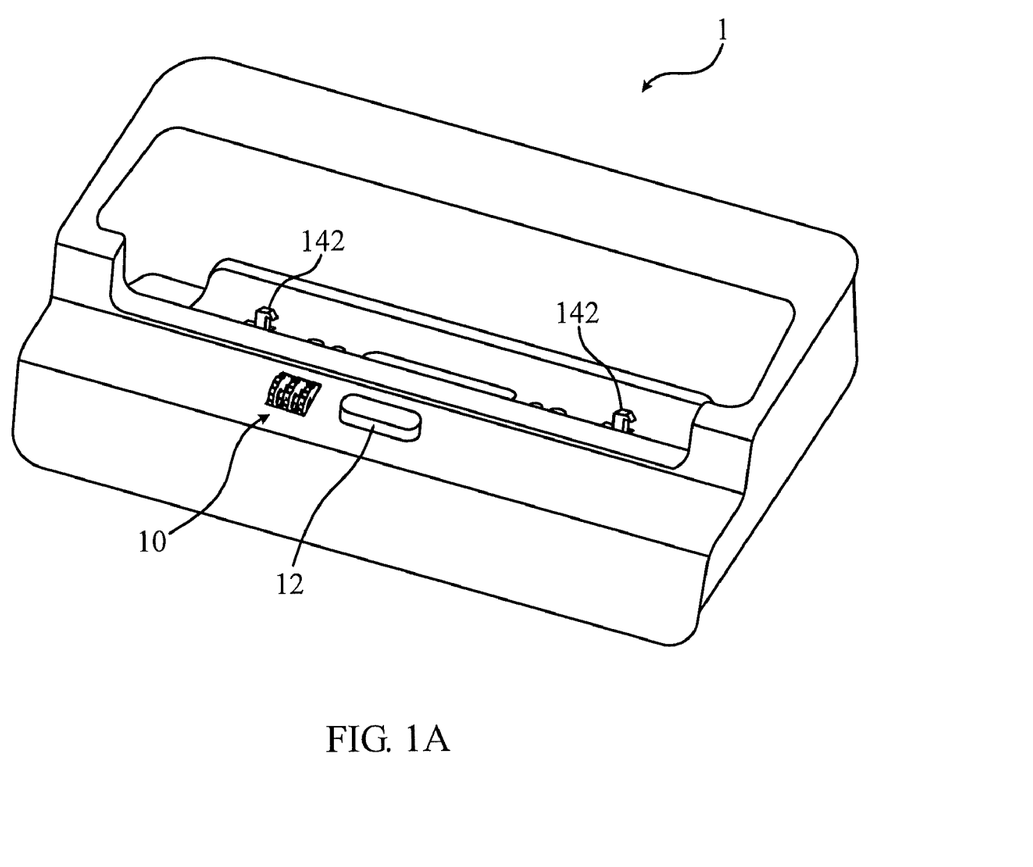
FIG. 1A is a schematic diagram showing a base according to one embodiment of the invention.
Figure 1B:
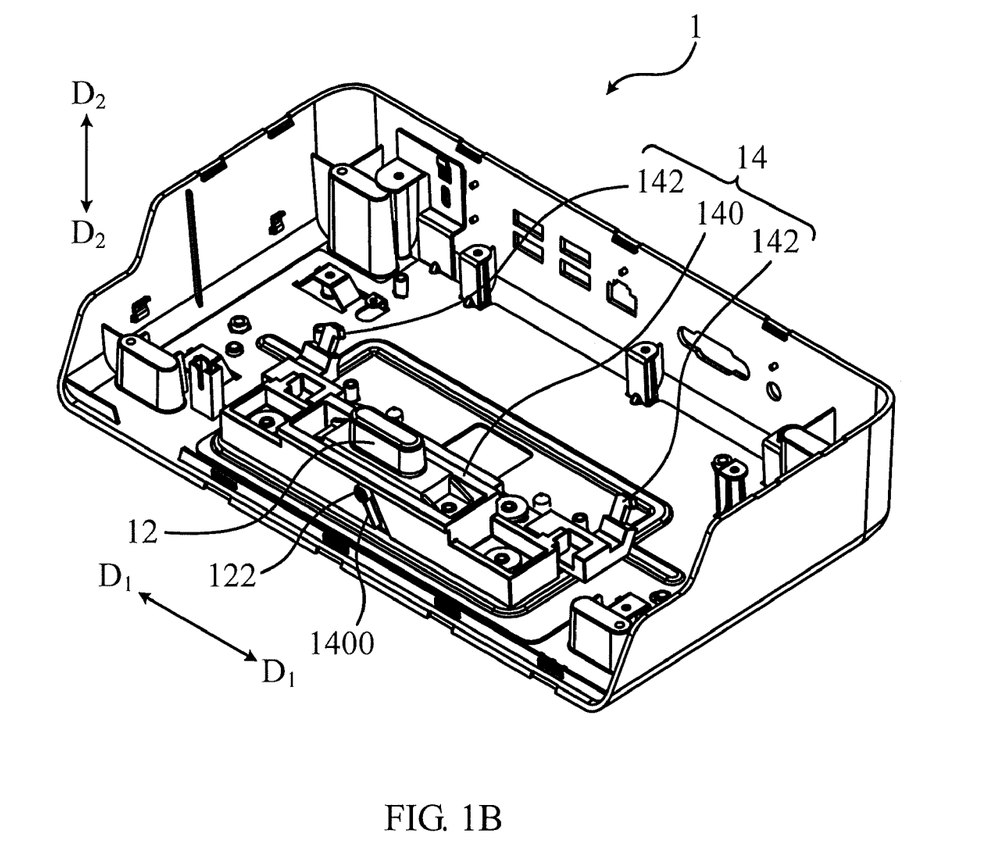
FIG. 1B is an isometric view showing the interior of the base in FIG. 1A.

FIG. 1A is a schematic diagram showing a base 1 according to one embodiment of the invention. FIG. 1B is an isometric view showing the interior of the base 1 in FIG. 1A. As shown in FIG. 1A, the base 1 in the embodiment of the invention can be applied to a common electronic device (such as a desktop computer, a notebook computer and so on). However, the invention is not limited thereto. In other words, as long as the electronic device has a detachable host and a base, the electronic device can use the base 1 in the embodiment of the invention to properly reduce probability of being stolen. In one embodiment, the host may be a notebook computer, a main part of a minicomputer and so on. However, the invention is not limited thereto.

As shown in FIG. 1A and FIG. 1B, the electronic device in the embodiment of the invention includes a host (not shown) and a base 1. The base 1 mainly includes an engaging module 14, a release button 12 and a code lock module 10. The engaging module 14 mainly includes a linking element 140 and connecting elements 142. The linking element 140 has a guiding portion 1400, and the linking element 140 is disposed at the base 1 and can slide relative to the base 1 along a direction $D_1$. The connecting elements 142 are disposed at the base 1 and can be driven by the linking element 140 to slide relative to the base 1 along the direction $D_1$ thus to be engaged to the host. In one embodiment, the connecting elements 142 can be hooks in FIG. 1B. However, the invention is not limited thereto. In one embodiment, the guiding portion 1400 of the linking element 140 can be a sliding groove in FIG. 1B, and the release button 12 can have a guiding pole 122 slidably disposed at the guiding portion 1400 of the linking element 140. However, the invention is not limited thereto. For example, a guiding pole which is the same as the guiding pole 122 of the release button 12 may be disposed at the linking element 140, and a sliding groove which is the same as the guiding portion 1400 of the linking element 140 may also be disposed at the release button 12. Thus, the same objective may also be achieved.

In addition, the host can have grooves (not shown) corresponding to the connecting elements 142. Therefore, the engaging module 14 can engage the host with the base 1 by engaging the connecting elements 142 with the grooves. When the host is mounted to the base 1 and is engaged to the engaging module 14, the guiding pole 122 of the release button 12 pressed towards a direction $D_2$ can press the guiding portion 1400 of the engaging module 14 thus to allow the linking element 140 to laterally move along the direction $D_1$, such that the connecting elements 142 of the engaging module 14 are driven to be separated from the host to release the host.

The disposition direction of the guiding portion 1400 of the linking element 140 can be between the sliding direction $D_1$ of the linking element 14 relative to the base 1 and the direction $D_2$ of pressing the release button 12. The operating principle is well known by skilled persons in the art. Therefore, it is not described herein for a concise purpose. In addition, the number of the connecting elements 142 of the engaging module 14 can also be increased over two. According to actual needs or limitation in design, persons having ordinary skill in the art can make changes without being limited to the embodiment. The structures, functions, and operating modes of the elements of the code lock module 10 of the base 1 in the embodiment of the invention are described hereinbelow in detail.

Figure 2A:
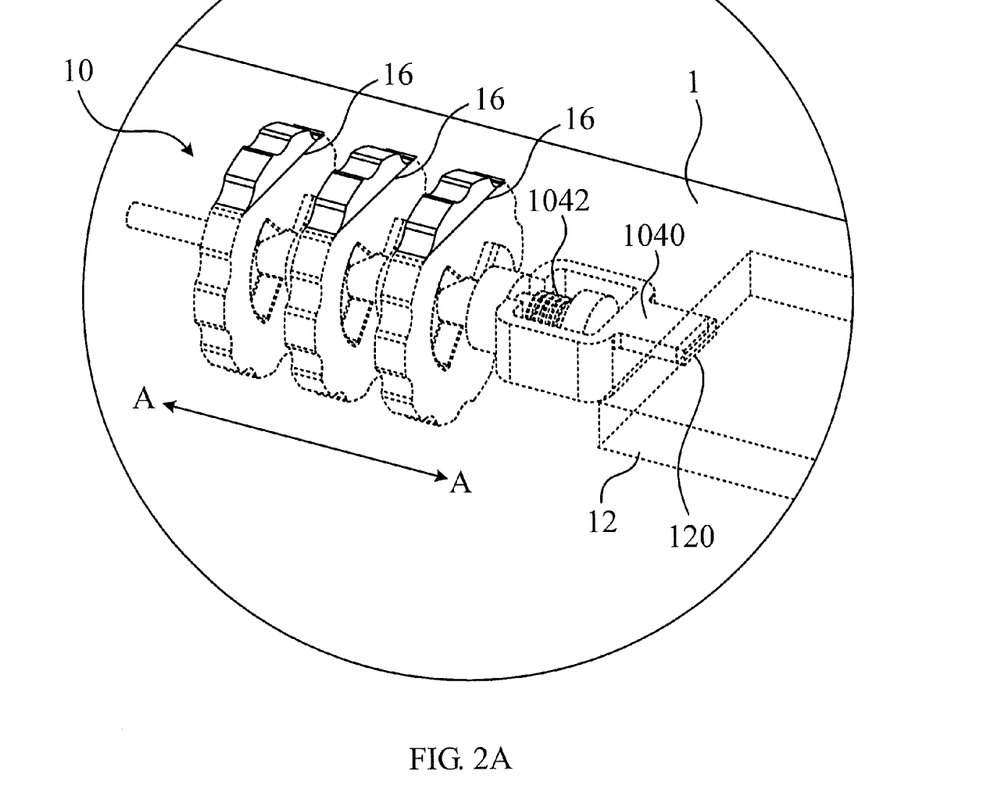
FIG. 2A is a perspective diagram showing interaction between a code lock module and a release button in the base in FIG. 1A, wherein the code lock module is in a locking state.

FIG. 2A is a perspective diagram showing interaction between the code lock module 10 and the release button 12 in the base 1 in FIG. 1A. In FIG. 2A, the code lock module 10 is in a locking state. As shown in FIG. 2A, the code lock module 10 in the embodiment of the invention can also be applied to a common host (such as a desktop computer, a notebook computer and so on). However, the invention is not limited thereto. In other words, as long as a host has important electronic components therein, the host can use the code lock module 10 in the embodiment of the invention to properly reduce probability of being stolen. In one embodiment, the important electronic components may be a hard disk, a memory, a CPU and so on. However, the invention is not limited thereto.

Figure 2B:
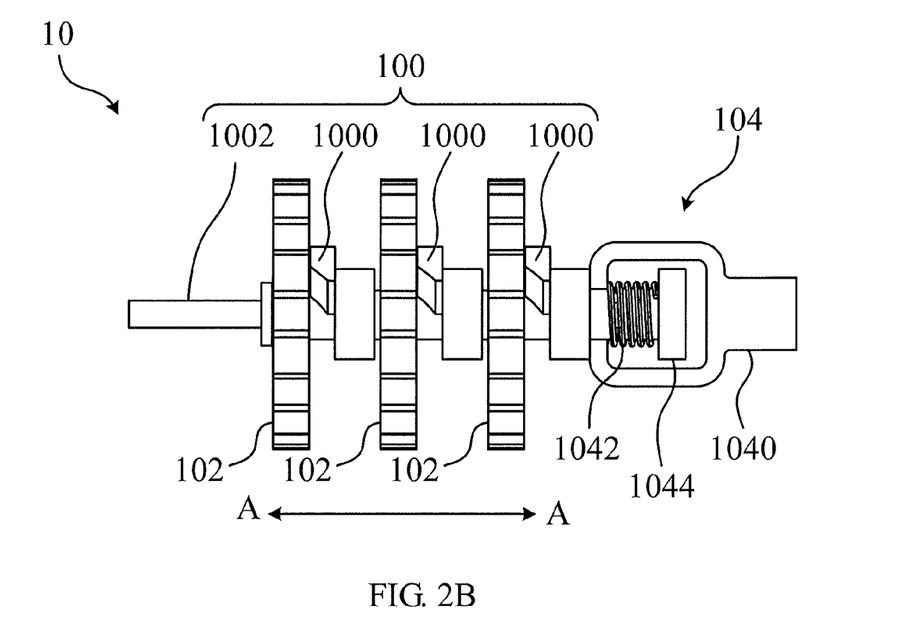
FIG. 2B is a top view showing the code lock module in FIG. 2A.
Figure 2C:
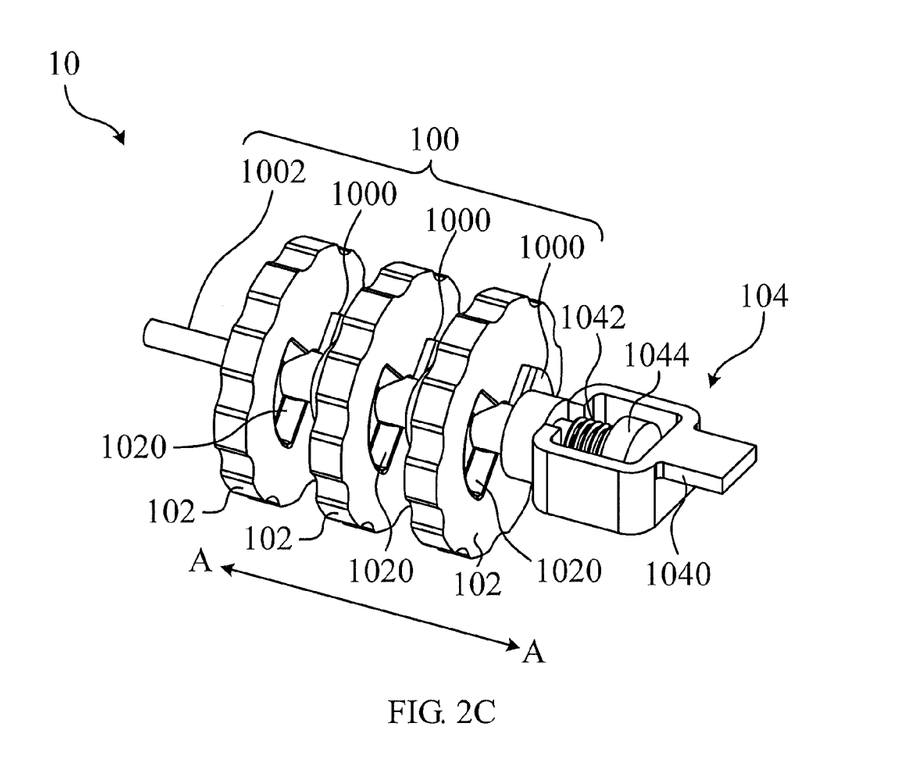
FIG. 2C is an isometric view showing the code lock module in FIG. 2A.
Figure 2D:
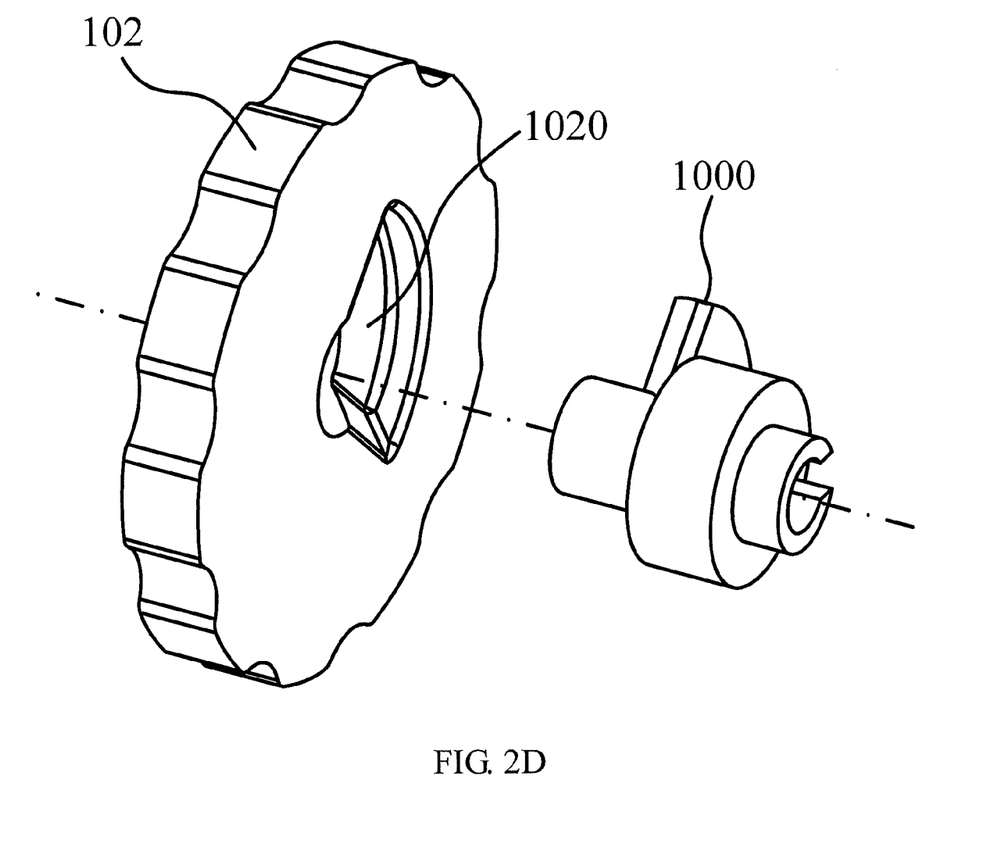
FIG. 2D is a three-dimensional exploded diagram showing dials and corresponding cams in FIG. 2A.

FIG. 2B is a top view showing the code lock module 10 in FIG. 2A. FIG. 2C is an isometric view showing the code lock module 10 in FIG. 2A. FIG. 2D is a three-dimensional exploded diagram showing dials 102 and corresponding cams 1000 in FIG. 2A. As shown in FIG. 2B and FIG. 2C, the code lock module 10 in the embodiment of the invention mainly includes a cam assembly 100, a plurality of dials 102, and a retaining assembly 104. The structures, functions, and operating modes of the elements are described hereinbelow in detail.

The cam assembly 100 can move relative to the base 1 along an axis A-A. Further, the cam assembly 100 includes a plurality of cams 1000 arranged along the axis A-A. To allow the cams 1000 of the cam assembly 100 to move along the axis A-A instead of being rotated, a groove (not shown) in which the cam assembly 100 can slide can be correspondingly disposed at a casing of the base 1 along the axis A-A, and the profile of the groove corresponds to that of the cam assembly 100. The objective of preventing the cams 1000 from being rotated is to fix the angles of the cams 1000 thus to provide a certain basis when the dials 102 are rotated to a correct code.

As shown in FIG. 2A, FIG. 2C, and FIG. 2D, the dials 102 are sleeved on the cam assembly 100 and can be rotated relative to the base 1. Each of the dials 102 has a recess 1020 for containing one of the cams 1000. To allow the dials 102 to be rotated instead of sliding relative to the base 1 (or the cam assembly 100), a space (not shown) can also be disposed at the casing of the base 1 for partly containing the dials 102, and openings 16 are disposed to expose portions of the dials 102.

Thereby, a user can rotate the portions of the dials 102 exposed from the openings 16 to rotate the dials 102.

As shown in FIG. 2B, the retaining assembly 104 includes a lock head 1040 and an elastic element 1042, and the cam assembly 100 further includes a fastening element 1002. A bolt shown in FIG. 2B as the fastening element 1002 is taken for example in the embodiment of the invention, however, the invention is not limited thereto. The lock head 1040 is connected with the cam assembly 100 and can move along the axis A-A to be fastened to or separated from the release button 12 (please refer to FIG. 2A and FIG. 2B together).

In one embodiment, one end of the release button 12 for being fastened to the code lock module 10 can have a slot 120. When the lock head 1040 is fastened to the slot 120 of the release button 12, the release button 12 is locked by the fastening between the lock head 1040 and the slot 120. At that moment, as show in FIG. 2A, the release button 12 cannot be pressed. In another embodiment, the release button 12 may not have the slot 120, and the lock head 1040 of the code lock module 10 may be designed to be fastened under the end of the release button 12, such that the release button 12 cannot be pressed and the objective and function of the code lock module 10 in the embodiment of the invention may also be achieved.

As shown in FIG. 2A and FIG. 2B, the fastening element 1002 (in the embodiment, it is the bolt) is disposed at the base 1 along the axis A-A for fastening the code lock module 10 to the base 1. The cam assembly 100 and the elastic element 1042 are sleeved on the fastening element 1002, and the dials 102 are further sleeved on the cam assembly 100. Thereby, the cam assembly 100 can further slide with the fastening element 1002 along the axis A-A, and the dials 102 can further be rotated relative to the fastening element 1002 and the cam assembly 100.

In addition, one end of the fastening element 1002 can form a stopping block 1044, and the elastic element 1042 is connected with the lock head 1040. Thereby, the elastic element 1042 can be compressed between the stopping block 1044 and the lock head 1040. Certainly, if the elastic element 1042 may be against the base 1, the elastic element 1042 may also be directly compressed between the base 1 and the lock head 1040. In one embodiment, the elastic element 1042 may be a spring. However, the invention is not limited thereto. Skilled persons in the art can use other elastic objects to replace the elastic element 1042 to be applied to the code lock module 10 in the embodiment of the invention.

In another embodiment, the retaining assembly 104 may further include a screw nut (not shown) for replacing the stopping block 1044. The screw nut is detachably screwed to the end of the fastening element 1002. The elastic element 1042 may also be compressed between the screw nut and the cam assembly 100.

Certainly, the fastening element 1002 and the screw nut may not be necessarily included in the retaining assembly 104 of the code lock module 10 in the embodiment of the invention. As long as the casing of the base 1 can allow the elastic element 1042 to be fastened and be against thereto, the function and objective of the code lock module 10 in the embodiment of the invention can still be achieved.

In addition, with regards to the assembling mode of the cam assembly 100 and the dials 102, the cam assembly 100 can be divided into a plurality of cams 1000 thus to allow the dials 102 to be assembled with and sleeved on the cams 1000 in a one-to-one mode. Thereby, when any one of the cams 1000 is pushed, all the cams 1000 between the pushed cam 1000 and the cam 1000 fastened to the lock head 1040 can move together to push the lock head 1040 to be fastened to the release button 12. Further, after the dials 102 are assembled with and sleeved on the cams 1000 in the one-to-one mode, each cam 1000 of the assembled cam assembly 100 can also be fastened to each other by a process (such as soldering, adhering and so on). Thereby, when any one of the cams 1000 is pushed, the whole cam assembly 100 moves together. Further, the angle of each cam 1000 is not limited to that shown in FIG. 2C, and the angles of the cams 1000 can be adjusted according to the code needed to be set.

The fastening element 1002 is disposed at the base 1 and cannot move relative to the base 1. To allow the code lock module 10 in the embodiment of the invention to be in the locking state in FIG. 2A, as long as any one of the dials 102 is rotated to be separated from the corresponding cam 1000, each cam 1000 of the cam assembly 100 can be separated from the corresponding recess 1020. At that moment, the cam assembly 100 can move along the axis A-A to approach and push the lock head 1040 fastened to the cam assembly 100 to be fastened to the release button 12, and the elastic element 1042 is compressed to be elastically deformed. To allow the cams 1000 to be easily separated from the recesses 1020 when the dials 102 are rotated, edges of the recesses 1020 can be designed to be inclined to the axis A-A.

Figure 3A:
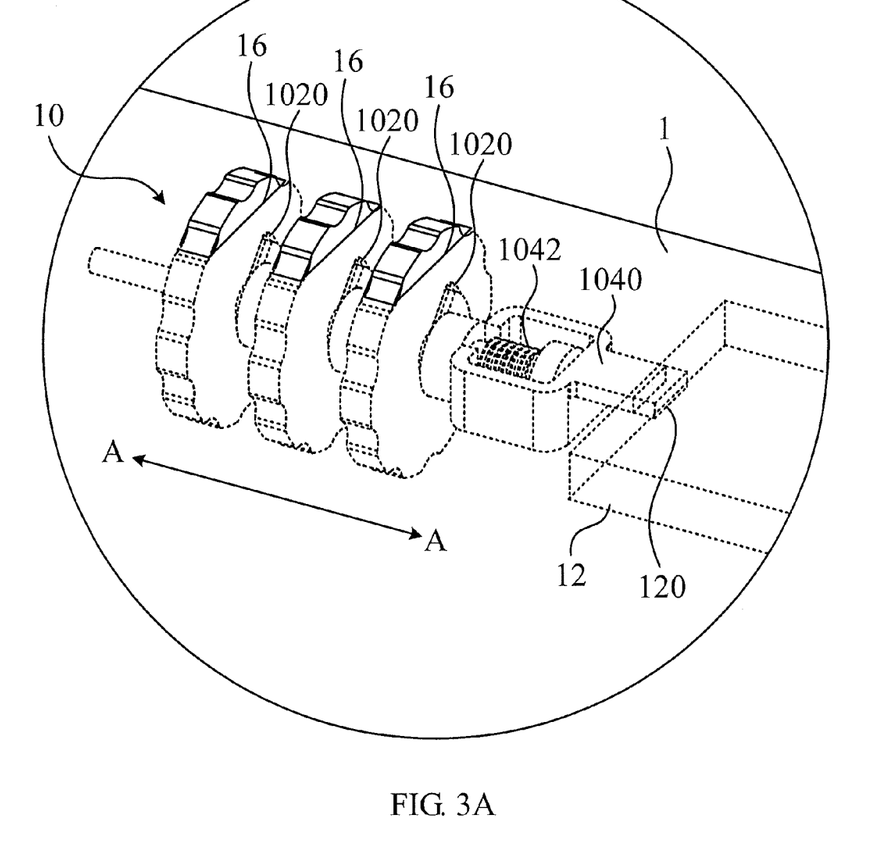
FIG. 3A is a perspective diagram showing interaction between the code lock module and the release button in the base in FIG. 2A, wherein the code lock module is in an unlocking state.
Figure 3B:
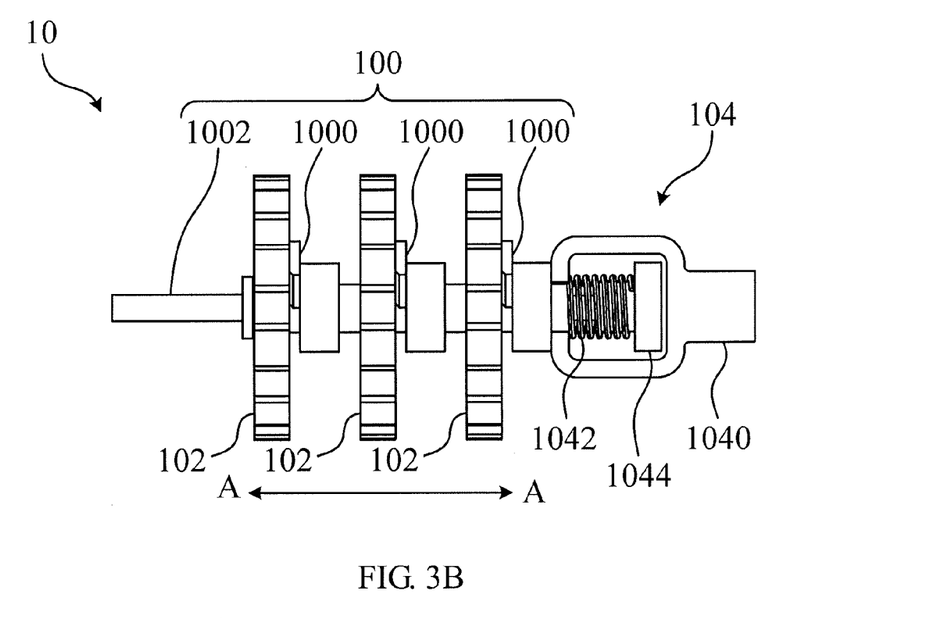
FIG. 3B is a top view showing the code lock module in FIG. 3A.
Figure 3C:
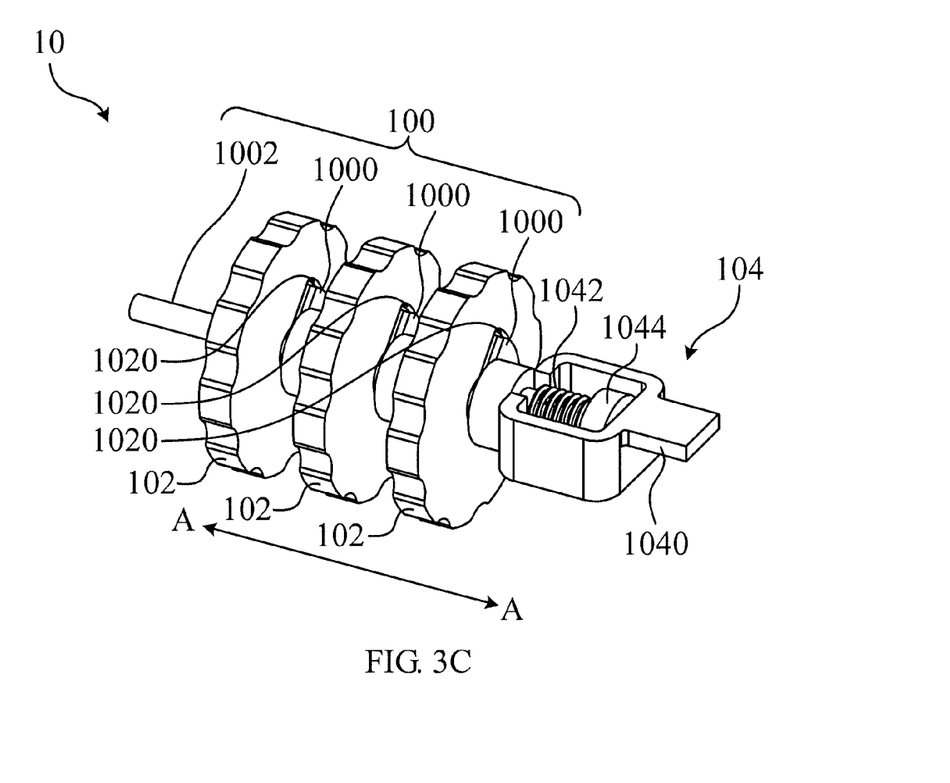
FIG. 3C is an isometric view showing the code lock module in FIG. 3A.

Please refer to FIG. 3A, FIG. 3B, and FIG. 3C. FIG. 3A is a perspective diagram showing interaction between the code lock module 10 and the release button 12 in the base 1 in FIG. 2A. In FIG. 3A, the code lock module 10 is in an unlocking state. FIG. 3B is a top view showing the code lock module 10 in FIG. 3A. FIG. 3C is an isometric view showing the code lock module 10 in FIG. 3A. When the dials 102 are rotated to allow each recess 1020 to contain the corresponding cam 1000, the cam assembly 100 moves away from the lock head 1040 along the axis A-A, and the elastic element 1042 is restored to drives the lock head 1040 to be separated from the release button 12 thus to release the host by pressing the release button 12. Further, as shown in FIG. 3A, when the lock head 1040 is separated from the slot 120, the release button 12 is pressed downwardly relative to the base 1.

In another embodiment, the dials 102 may have protrusions (not shown) similar to the cams 1000, and the cams 1000 of the cam assembly 100 may be replaced with other objects (not shown) having recesses corresponding to the protrusions. In other words, in the embodiment, to allow the code lock module 10 to be in the locking state, as long as any one of the dials 102 is rotated, the protrusion of each dial 102 may be separated from the recess of the corresponding object. At that moment, the cam assembly 100 may move along the axis A-A to approach and push the lock head 1040 fastened to the cam assembly 100 to be fastened to the release button 12, and the elastic element 1042 is compressed to be elastically deformed. Further, when the dials 102 are rotated to allow each protrusion to be contained in the corresponding recess, the cam assembly 100 moves away from the lock head 1040 along the axis A-A, and the elastic element 1042 is restored and drives the lock head 1040 to be separated from the release button 12 thus to unlock the code lock module 10 to allow the release button 12 to be pressed.

In one embodiment, the dials 102 may be number dials, English letter dials, or phonetic symbol dials. Certainly, code symbols on the dials 102 may also include numbers, English letters, and phonetic symbols at the same time. However, the invention is not limited to the common symbols. Symbols in other languages may also be applied to the code lock module 10 in the embodiment of the invention.

According to the above detailed description about the preferred embodiments of the invention, the base and the electronic device in the embodiments of the invention provide a code lock at the base to which the host of the electronic device (such as a minicomputer) is fastened, such that the host is fastened to the base thus to be properly locked to the base. Thereby, as the base and the electronic device using the same in the invention are used, an illegal person fails to make an illegal act by easily taking away the host from the base.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A base for detachably containing a host, the base comprising:
   an engaging module for engaging the host;
   a release button for pressing the engaging module thus to allow the engaging module to release the host; and
   a code lock module including:
      a cam assembly including a plurality of cams arranged along an axis;
      a plurality of dials rotatably connected with the cams respectively, each of the dials having a recess for containing one of the cams; and
      a retaining assembly including:
         a lock head connected with the cam assembly and capable of moving along the axis to be fastened to or separated from the release button; and
         an elastic element connected with the lock head,
      wherein when any one of the dials is rotated to separate at least one of the cams from the corresponding recess, the cam assembly moves along the axis to push the lock head to be fastened to the release button and make the elastic element being elastically deformed, and when the dials are rotated to allow each recess to contain one cam, the cam assembly moves away from the lock head along the axis, and the elastic element is restored to drive the lock head to be separated from the release button thus to release the host by pressing the release button.

2. The base according to claim 1, wherein the cam assembly further comprises a fastening element for fastening the code lock module to the base, and the elastic element is compressed between the fastening element and the lock head.

3. The base according to claim 2, wherein the fastening element comprises a bolt, and the cams and the elastic element are sleeved on the bolt.

4. The base according to claim 3, wherein one end of the bolt forms a stopping block, and the elastic element is connected with the stopping block and the lock head.

5. The base according to claim 3, wherein the retaining assembly further comprises a screw nut screwed to one end of the bolt, and the elastic element is connected with the screw nut and the lock head.

6. The base according to claim 1, wherein the dials are selected from the group consisting of a number dial, an English letter dial, and a phonetic symbol dial.

7. The base according to claim 1, wherein the elastic element is a spring.

8. The base according to claim 1, wherein the engaging module comprises:
   a linking element having a guiding portion, the linking element disposed at the base and capable of sliding relative to the base; and
   a connecting element disposed at the base and capable of being driven by the linking element to be engaged to the host.

9. The base according to claim 8, wherein the release button has a guiding pole, the guiding portion is a sliding groove, the guiding pole is slidably disposed at the sliding groove, and the guiding pole presses the guiding portion to allow the linking element to slide thus to drive the connecting element to release the host when the release button is pressed.

10. The base according to claim 8, wherein the connecting element is a hook, the host has a groove corresponding to the hook, and the host is engaged to the base by connecting the hook with the groove.

11. An electronic device comprising:
    a host; and
    a base for detachably containing a host, the base comprising:
       an engaging module for engaging the host;
       a release button for pressing the engaging module thus to allow the engaging module to release the host; and
       a code lock module including:
          a cam assembly including a plurality of cams arranged along an axis;
          a plurality of dials rotatably connected with the cams respectively, each of the dials having a recess for containing one of the cams; and
          a retaining assembly including:
             a lock head connected with the cam assembly and capable of moving along the axis to be fastened to or separated from the release button; and
             an elastic element connected with the lock head,
          wherein when any one of the dials is rotated to separate at least one of the cams from the corresponding recess, the cam assembly moves along the axis to push the lock head to be fastened to the release button and make the elastic element being elastically deformed, and when the dials are rotated to allow each recess to contain one cam, the cam assembly moves away from the lock head along the axis, and the elastic element is restored to drive the lock head to be separated from the release button thus to release the host by pressing the release button.

12. The electronic device according to claim 11, wherein the cam assembly further comprises a fastening element for fastening the code lock module to the base, and the elastic element is compressed between the fastening element and the lock head.

13. The electronic device according to claim 12, wherein the fastening element comprises a bolt, and the cams and the elastic element are sleeved on the bolt.

14. The electronic device according to claim 13, wherein one end of the bolt forms a stopping block, and the elastic element is connected with the stopping block and the lock head.

15. The electronic device according to claim 13, wherein the retaining assembly further comprises a screw nut screwed to one end of the bolt, and the elastic element is connected with the screw nut and the lock head.

16. The electronic device according to claim 11, wherein the dials are selected from the group consisting of a number dial, an English letter dial, and a phonetic symbol dial.

17. The electronic device according to claim 11, wherein the elastic element is a spring.

18. The electronic device according to claim 11, wherein the engaging module comprises:
   a linking element having a guiding portion, the linking element disposed at the base and capable of sliding relative to the base; and
   a connecting element disposed at the base and capable of being driven by the linking element to be engaged to the host.

19. The electronic device according to claim 18, wherein the release button has a guiding pole, the guiding portion is a sliding groove, the guiding pole is slidably disposed at the sliding groove, and the guiding pole presses the guiding portion to allow the linking element to slide thus to drive the connecting element to release the host when the release button is pressed.

20. The electronic device according to claim 18, wherein the connecting element is a hook, the host has a groove corresponding to the hook, and the host is engaged to the base by connecting the hook with the groove.

* * * * *